United States Patent [19]

Pellegrini

[11] Patent Number: 5,483,173
[45] Date of Patent: Jan. 9, 1996

[54] CURRENT MEASURING STRUCTURE FOR TESTING INTEGRATED CIRCUITS

[75] Inventor: Franco Pellegrini, Corsico, Italy

[73] Assignee: SGS-Thomson Microelectronics S.r.l., Agrate Brianza, Italy

[21] Appl. No.: 129,424

[22] Filed: Sep. 30, 1993

[30] Foreign Application Priority Data

Sep. 30, 1992 [EP] European Pat. Off. ............. 92830543

[51] Int. Cl.[6] .................................................. G01R 31/00
[52] U.S. Cl. ............................................ 324/765; 324/126
[58] Field of Search ................................. 324/765, 126

[56] References Cited

U.S. PATENT DOCUMENTS

| | | | |
|---|---|---|---|
| 2,874,354 | 2/1959 | Bell | 324/115 |
| 3,772,595 | 11/1973 | DeWolf et al. | |
| 4,442,397 | 4/1984 | Ishikawa et al. | 323/275 |
| 4,623,950 | 11/1986 | Palara et al. | 361/79 |

OTHER PUBLICATIONS

Electronic Components & Applications, vol. 10, No. 1, Oct. 1990. Einhoven, NL, pp. 53–58, XP000229355. Humphreys "Introducing the Philips Sensorfet".

Forrest M. Mims, III "Getting Started in Electronics" 1983, p. 107, Radio–Shack Catalog No. 276–5003.

Primary Examiner—Kenneth A. Wieder
Assistant Examiner—Kourosh Cyrus Khosravi
Attorney, Agent, or Firm—David M. Driscoll; James H. Morris; Brett N. Dorny

[57] ABSTRACT

A measuring structure includes a first resistor for converting a current to be measured into a voltage, and an operational amplifier for measuring the current. A second resistor connected in series to, and integrated with, the first resistor, is activated by an input terminal solely at the wafer testing stage, to reduce, in relation to the nominal value, the current corresponding to a predetermined voltage value detected by the operational amplifier, and to enable optimum correlation of the reduced current value obtainable during wafer testing and the corresponding nominal current value.

18 Claims, 1 Drawing Sheet

CURRENT MEASURING STRUCTURE FOR TESTING INTEGRATED CIRCUITS

BACKGROUND OF THE INVENTION

1. Field of the Invention

The present invention relates to a current measuring structure for testing integrated circuits.

2. Discussion of the Related Art

Integrated circuits are tested at various stages in the course of production. Tests include wafer testing (often referred to as EWS—Electrical Wafer Sort) in which the whole wafer (semiconductor slice in which various devices are integrated) is tested prior to separating the chips; and final testing of the separate chips mounted in the respective packages.

In the case of power integrated circuits, the wafer test provides, among other things, for measuring various high currents, which are subsequently related to similar currents measured at the final test stage. A typical example is measurement of the current value triggering the current limiting circuit with which the power stages are normally provided.

The above measurement is critical regarding both forcing the current and acquiring measuring data, due to the high-energy voltage peaks ("spikes") produced by high currents in the presence of parasitic inductance caused by the measuring devices. Moreover, at the high current levels involved, the pad sensors are subject to severe wear, thus resulting in gradual aging of the measurement with time; and, finally, problems are encountered in relating the wafer and final test measurements, due to differing power dissipation conditions.

To reduce the criticalness of the measurement and to overcome the aforementioned drawbacks, a known practice for wafer testing is to measure a current lower than, but related to, the normal operating current. To demonstrate this approach, FIG. 1 shows a known solution relative to a power stage with a d.c. current limiting circuit. The following account also applies to other solutions featuring switch-operated limiting circuits, by virtue of both types being based on current-voltage conversion by a calibrated resistor for generating a voltage proportional to the current through the power stage.

In FIG. 1, the power stage and the limiting circuit are shown schematically. The power stage, which forms part of integrated circuit 1a, includes a power MOS transistor 2 supplied at the drain terminal by current source 3; and the limiting stage 4 comprises an operational amplifier 5, the output of which is connected to the drain terminal of transistor 2 for limiting the current supplied to transistor 2, and the two inputs of which are connected to the two terminals of a sensing resistor 6 series connected to the source terminal of transistor 2. In particular, the negative input of amplifier 5 is connected to the common node between the drain terminal of transistor 2 and a first terminal of resistor 6; and the positive input of amplifier 5 is connected to the other terminal of resistor 6 through a voltage source 7 supplying voltage $V_R$.

Resistor 6 of limiting circuit 4 normally consists of a suitably sized metal strip, and has an accurately known resistance $R_s$ normally ranging between a few tens and a few hundred mΩ, for reducing both power dissipation and the voltage drop in series with the power stage, so that Voltage drop $V_1$ at the terminals of resistor 6 is generally on the order of a hundred mV at most.

In the FIG. 1 circuit, limiting stage 4 is operated when $V_1 \approx V_R$, i.e. when current $I_L$ through transistor 2, and consequently resistor 6 equals:

$$I_L = V_R/R_s \qquad (1)$$

One technique for determining operation of the limiting circuit at less than the nominal current provided during normal operation of the integrated circuit includes reducing voltage $V_R$ supplied by source 7 during the wafer test stage. Such a reduction, which may be achieved in various ways has several basic drawbacks affecting correct correlation of the wafer and final test measurements, and thus resulting in problems in terms of electrical yield.

The major problem posed by the above approach relates to the voltage Offset of operational amplifier 5. To obtain a limit current for wafer testing reduced by a scaling factor of 10, for example, in relation to the nominal value, Equation (1) indicates that $V_R$ must also be reduced by the same scaling factor to obtain values on the order of about 10 mV. As operational amplifiers normally employed for such applications have an offset of 1–2 mV, an excessively high measuring spread of 10–20% results. Accordingly, this known approach is only feasible in the case of very low scaling factors, thus reducing the advantages to be gained.

Furthermore, as the $V_R$ reduction factor increases, measuring repeatability decreases, due to a reduction in $V_R$, emphasizing inaccuracy due to noise.

SUMMARY OF THE INVENTION

It is an object of the present invention to provide a current measuring structure for testing integrated circuits. The present invention is designed to overcome the aforementioned drawbacks typically associated with known solutions, and which provides for sufficiently reliable, accurate testing and correlation for determining the efficiency of the integrated circuit.

According to the present invention, a current measuring circuit for testing integrated circuits includes a current sensor having an electrical resistance. A current measuring means is connected to the sensor and generates a signal based on the current through the resistance. Integrated with the sensor is a means for varying the resistance of the sensor.

Preferably, the resistance includes a first metal strip, and the means for varying includes a second method strip connected to the first metal strip at a common terminal. Each strip has an end with a second terminal connected to inputs of the current measuring means, which preferably includes an operational amplifier. Current is measured at the common terminal and at the second terminal of the second metal strip. A contact coupled to the terminal can be connected or left floating, depending on the operating condition, and thus the resistance is selectively varied. By selecting the metal strips appropriately, desired scaling factors can be obtained.

Instead of reducing the voltage drop at which the limiting circuit is activated, the current/voltage conversion resistance is increased by means of a resistive element formed in the integrated circuit and series connected to the current/voltage resistor, and which is activated during testing.

BRIEF DESCRIPTION OF THE DRAWINGS

A preferred non-limiting embodiment of the present invention will be described by way of example with reference to the accompanying drawings, in which.

DETAILED DESCRIPTION

Figure 1:
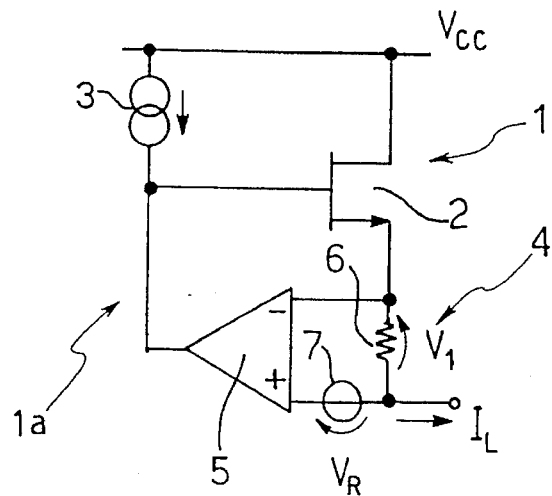
FIG. 1 is a simplified circuit diagram of a power stage with a known current limiting circuit.
Figure 2:
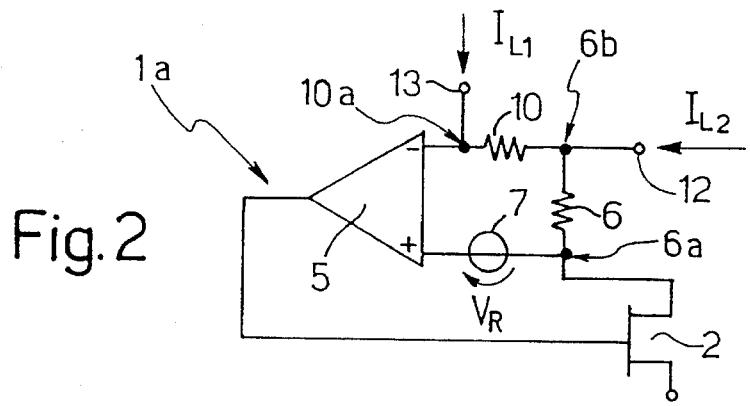
FIG. 2 is an equivalent circuit diagram of the structure according to the present invention applied to the known limiting circuit.

As shown in FIG. 2, in which components similar to those in FIG. 1 are indicated using the same numbering system, the positive input of operational amplifier 5 is connected to one terminal 6a of sensing resistor 6, while the negative input is connected to the other terminal 6b of resistor 6 via a second resistor 10, also indicated as a sensing resistor for wafer testing and having a resistance $R_{s1}$. Terminal 6a of sensing resistor 6 is also connected to the drain terminal of transistor 2, while terminal 6b is connected to input terminal 12 of the integrated circuit. The negative input of operational amplifier 5 connected to terminal 10a of resistor 10 is also connected to a second input terminal 13 of the integrated circuit.

Figure 3:
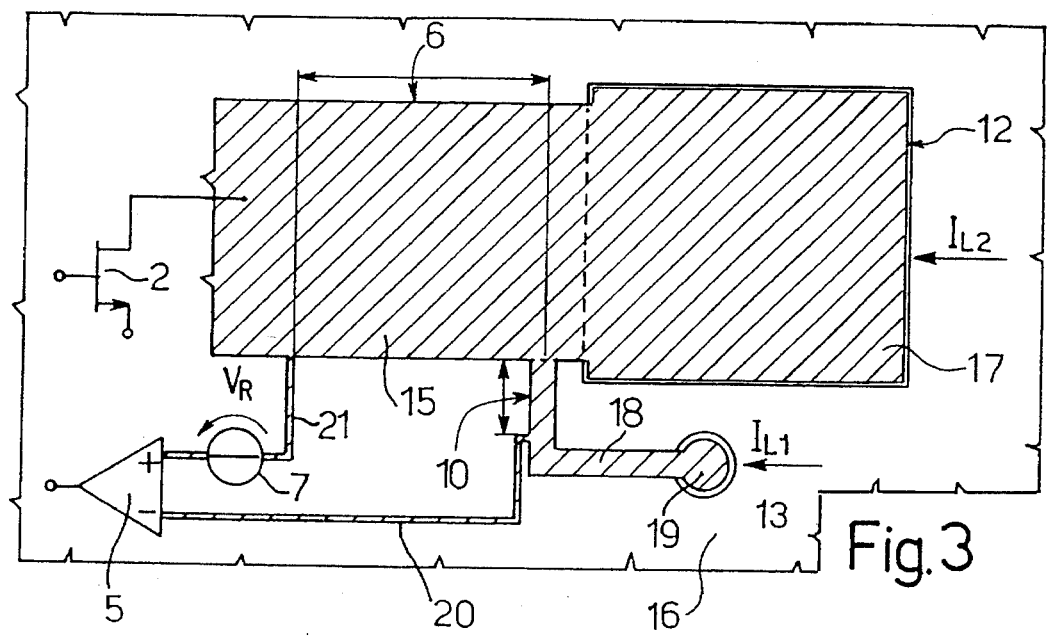
FIG. 3 is a plan view of the FIG. 2 structure as implemented.

According to the present invention, resistors 6 and 10 are integrated in the same integrated circuit 1a, and are formed contiguously using the same technology. Referring to FIG. 3, a metal strip 15 is shown on the substrate 16 in which circuit 1a, and more specifically transistor 2 and operational amplifier 5 (shown only schematically), is integrated. A portion of strip 15 forms sensing resistor 6 of limiting circuit 4. Strip 15 is connected at one end to the drain terminal of transistor 2 (as shown schematically), and at the other end to a pad 17 defining input terminal 12 and to which is applied a probe (not shown) for measuring current $I_{L2}$ through transistor 2 at the final test stage.

From the end of metal strip 15 connected to pad 17 (terminal 6b), there extends a further suitably sized metal strip 18, one portion of which defines sensing resistor 10 for wafer testing. Metal strip 18 terminates at a second pad 19 smaller than pad 17 and defining input terminal 13 to which a probe is applied for measuring current $I_{L1}$ through transistor 2 at the wafer test stage. Wafer test pad 19 is also connected by a metal connecting line 20 to the negative input of operational amplifier 5 (shown only schematically), the positive input of which is connected to metal strip 18 by metal connecting line 21 and through voltage source 7 (shown only schematically).

In the integrated circuit, resistor 10 provides three functions: when wafer testing, it acts as a sensing resistor for detecting the current through transistor 2; in other situations, it modulates the current through terminal 12; and, in all other situations, it simply provides for connecting the negative input of operational amplifier 5 to resistor 6. In the wafer testing situation, pad 19 is connected to a measuring probe; in another situation, pad 19 is connected to appropriate circuit elements for supplying variable current to affect the value of the current through resistor 6; and, in yet another situation, pad 19 remains floating. When wafer testing, therefore, current $I_{L1}$ through transistor 2 and terminal 13 flows through both resistors 6 and 10, and the intervention condition of the limiting loop corresponds with a current $I_{L1}$ value of:

$$I_{L1}=V_s+R_{s1} \qquad (2)$$

$$I_{L1}=V_R/(R_s+R_{s1})$$

as shown in FIG. 2.

When final testing, terminal 13 is left floating. No current, other than the negligible input current of operational amplifier 5, flows through resistor 10. The current/voltage conversion required for testing is performed solely by resistor 6. The intervention condition of the limiting loop is reached when the current through transistor 2 and measured at terminal 12 has a value of:

$$I_{L2}=V_R/R_s \qquad (3)$$

As such, the ratio between the nominal intervention currents measured respectively at the final and wafer test stages is determined by the following scaling factor K:

$$K=I_{L2}/I_{L1}=(R_s+R_{s1})/R_s$$

which, by appropriately sizing $R_{s1}$, easily provides for scaling factors as high as 10–15.

The advantages of the structure according to the present invention will be clear from the foregoing description. In particular, it provides for achieving a scaling factor sufficient for the specific purpose in question, thus eliminating drawbacks posed by comparable current measurements at the wafer and final test stages, and so reducing the criticalness of the measurement and wear of the probes, and providing for improved correlation, Regarding correlation, in particular, the present invention works well due to the fact that it depends on the type and repeatability of the manufacturing process and, in particular, on the matching of resistors 6 and 10. Formation of the resistors contiguously and at the same manufacturing stage provides for excellent matching, with no particular electrical or layout provisions required. In actual practice, even for high scaling factors such as 10–15, mismatching, mainly for phototechnical reasons, has been estimated at about a few percent.

Manufacture of the structure and related circuits is therefore straightforward and economical by virtue of involving no special machinery or technology.

Finally, the structure according to the present invention may be employed for additional functions during normal operation of the circuit in which it is integrated, e.g., for modulating current supply to terminal 12, as already stated.

To those skilled in the art it will be clear that changes may be made to the structure as described and illustrated herein without, however, departing from the scope of the present invention.

What is claimed is:

1. A circuit for testing a current limiting loop in a power device, the circuit comprising:

an integrated current sensing resistance, coupled to the power device, for receiving a current flowing through the power device, and for providing first and second current paths through the sensing resistance for the current, the first and second current paths respectively having first and second resistances;

a current measuring device coupled across the current sensing resistance for determining whether the current exceeds a thresholds, and for outputting an electrical signal when the threshold is exceeded; and.

2. The circuit of claim 1, wherein the sensing resistance includes a first resistive element, a second resistive element, a first contact element, coupled to the first resistive element, for receiving a current for the first current path, and a second contact element, coupled to the second resistive element, for receiving a current for the second current path, wherein the first current path includes the first contact element, the first resistive element, and the second resistive element, and wherein the second current path includes the second contact element, and the second resistive element.

3. The circuit of claim 2, wherein the first and second resistive elements are each formed from a strip of resistive material having first and second ends corresponding with the first and second terminals, respectively, the first ends of the strips of resistive material being contiguous.

4. The circuit of claim 3, wherein the strips of resistive material comprise metal strips on a substrate of semiconductor material, and wherein the first and second contact elements each comprise a pad.

5. The circuit of claim 4, wherein the metal strips are formed from a single layer of metal material.

6. The circuit of claim 5, wherein the current measuring device has first and second input terminals, each input terminal being connected to a respective second terminal of the resistive elements.

7. The circuit of claim 6, wherein the current measuring device includes an operational amplifier and a voltage source intermediate the second input terminal and the second terminal of the first resistive element.

8. The circuit of claim 2, wherein the current measuring device has first and second inputs connected to respective second terminals of the first and second resistive elements.

9. A circuit comprising:
   an integrated power stage through which a current to be measured flows;
   a current limiting circuit coupled to the power stage and including:
   a first resistive element through which the current to be measured flows,
   an operational amplifier coupled across the current limiting circuit for providing an electrical output signal responsive to the current flowing through the power stage, and
   a second resistive element connected in series to the first resistive element, the first resistive element and the second resistive elements having a first common terminal and each having a second terminal, the second terminal of the first element being connected to the power stage, the second terminals each being connected to different inputs of the operational amplifier, wherein the first and second resistive elements are integrated together; and
   a first contact element and a second contact element, the contact elements being connected respectively to the first common terminal and to the second terminal of the second resistive element, the first and second contact elements for receiving current input signals for first and second currents paths of the circuit respectively having first and second resistance values.

10. The circuit of claim 9 wherein the first and second resistive elements are each metal strips integrated on a single substrate.

11. A circuit for testing integrated circuits at at least two current levels, the circuit comprising:
    a first resistance through which a current to be measured flows;
    a current detector for providing an electrical signal based on a value of the current;
    a second resistance having a first terminal coupled to the first resistance, and a second terminal coupled to the current detector, the second resistance being integrated with the first resistance; and
    a first current receiving contact terminal coupled to the second terminal for selectively receiving a current signal.

12. The apparatus of claim 11 wherein the first and second resistances each include metal strips integrated on a substrate.

13. The apparatus of claim 11, wherein the current detector includes an operational amplifier coupled across the first and second resistances that detects when a value of the current exceeds a current limit.

14. The circuit of claim 13, further including a reference voltage V coupled to a terminal of the operational amplifier.

15. The circuit of claim 14, further including a second current receiving contact terminal coupled to the first terminal of the second resistance.

16. The circuit of claim 15, wherein the first resistance has a value R1 and the second resistance has a value R2, wherein the current limit for a first test is V/R1 when a current is provided at the second contact terminal and not the first, and wherein the current limit for a second test is V/(R1+R2) when current is provided at the first contact terminal and not the second.

17. The circuit of claim 16, wherein the first resistance is coupled to a terminal of an MOS transistor.

18. The circuit of claim 16, wherein (R1+R2)/R1 is about equal to 10.

* * * * *

UNITED STATES PATENT AND TRADEMARK OFFICE
CERTIFICATE OF CORRECTION

PATENT NO. : 5,483,173
DATED : January 9, 1996
INVENTOR(S) : Franco Pellegrini

It is certified that error appears in the above-identified patent and that said Letters Patent is hereby corrected as shown below:

Column 3, line 65, delete "$I_{L1} = V_S + R_{S1}$";

Column 4, line 58, replace "thresholds" with --threshold--; and

Column 4, line 59, replace "exceeded; and." with --exceeded.--.

Signed and Sealed this

Seventeenth Day of March, 1998

Attest:

BRUCE LEHMAN

Attesting Officer

Commissioner of Patents and Trademarks